(12) United States Patent
Eom et al.

(10) Patent No.: US 10,485,101 B2
(45) Date of Patent: Nov. 19, 2019

(54) FLEXIBLE DISPLAY DEVICE

(71) Applicant: Samsung Elecrronics Co., Ltd., Gyeonggi-do (KR)

(72) Inventors: Sang-Yong Eom, Suwon-si (KR); Dong-Sub Kim, Suwon-si (KR); Dong-Hui Kim, Hwaseong-si (KR); Mi-Sun Lee, Anyang-si (KR); Joon-Gyu Lee, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/646,040

(22) Filed: Jul. 10, 2017

(65) Prior Publication Data

US 2017/0311442 A1 Oct. 26, 2017

Related U.S. Application Data

(63) Continuation of application No. 14/210,073, filed on Mar. 13, 2014, now Pat. No. 9,736,931.

(30) Foreign Application Priority Data

Mar. 13, 2013 (KR) .......................... 10-2013-0026693

(51) Int. Cl.
*H05K 1/02* (2006.01)
*G02F 1/1333* (2006.01)
(Continued)

(52) U.S. Cl.
CPC ....... *H05K 1/0281* (2013.01); *G02F 1/13452* (2013.01); *G02F 1/133305* (2013.01);
(Continued)

(58) Field of Classification Search
CPC ........ H05K 1/0281; H05K 1/028; H05K 3/30; H05K 5/0017; H05K 2201/056;
(Continued)

(56) References Cited

U.S. PATENT DOCUMENTS

| 5,442,470 A | 8/1995 | Hashimoto |
| 5,703,665 A | 12/1997 | Muramatsu et al. |

(Continued)

FOREIGN PATENT DOCUMENTS

| CN | 102881710 A | 1/2013 |
| EP | 1261012 B1 | 7/2007 |

(Continued)

OTHER PUBLICATIONS

Foreign Communication from Related Counterpart Application; Chinese Patent Application No. 201410090743.2; Chinese First Office Action dated Aug. 29, 2017; 19 pages.

*Primary Examiner* — Nathanael R Briggs

(57) ABSTRACT

A flexible display device includes a flexible display panel, a flexible printed circuit board extending from the display panel, an integrated circuit chip that is mounted on at least one surface of the flexible printed circuit board and is configured to drive the display panel, and a protection member attached to a rear surface of the display panel. When the flexible printed circuit board is flexed to be partially positioned on the rear surface of the display panel, the protection member is positioned between the display panel and the integrated circuit chip. The flexible display device prevents the integrated circuit chip stacked with the display panel from making direct contact with the display panel using the protection member. Thus, even if the display device is deformed into, for example, a flexed or rolled state, it is possible to prevent the display panel from being damaged.

14 Claims, 2 Drawing Sheets

(51) Int. Cl.
*G02F 1/1345* (2006.01)
*H05K 3/30* (2006.01)
*H05K 5/00* (2006.01)

(52) U.S. Cl.
CPC ............... *H05K 1/028* (2013.01); *H05K 3/30* (2013.01); *H05K 5/0017* (2013.01); *H05K 2201/056* (2013.01); *H05K 2201/10128* (2013.01); *Y10T 29/49128* (2015.01)

(58) Field of Classification Search
CPC .... H05K 2201/10128; G02F 1/133305; G02F 1/13452; Y10T 29/49128
See application file for complete search history.

(56) References Cited

U.S. PATENT DOCUMENTS

| | | | |
|---|---|---|---|
| 6,411,353 B1 | 6/2002 | Yarita et al. | |
| 8,106,307 B2 | 1/2012 | Hayakawa et al. | |
| 2005/0088830 A1* | 4/2005 | Yumoto | G02F 1/13452 |
| | | | 361/749 |
| 2006/0152662 A1 | 7/2006 | Ko et al. | |
| 2011/0193478 A1 | 8/2011 | Kim | |
| 2012/0293960 A1 | 11/2012 | Takashima et al. | |
| 2013/0016049 A1 | 1/2013 | Eom et al. | |
| 2013/0016303 A1* | 1/2013 | Tokunaga | G02F 1/133308 |
| | | | 349/58 |
| 2013/0242249 A1* | 9/2013 | Azuma | G02F 1/133305 |
| | | | 349/150 |

FOREIGN PATENT DOCUMENTS

| | | |
|---|---|---|
| JP | H05341306 A | 11/1999 |
| JP | H11305205 A | 11/1999 |
| JP | 2012103438 A | 5/2012 |
| KR | 100627383 B1 | 9/2006 |
| KR | 1020070035302 | 3/2007 |
| KR | 20080032803 A | 4/2008 |
| KR | 101107176 B1 | 1/2012 |
| KR | 20120067075 A | 6/2012 |
| KR | 101182227 B1 | 9/2012 |
| KR | 20130008736 A | 1/2013 |
| KR | 101363341 B1 | 2/2014 |
| WO | 2006126363 A1 | 11/2006 |

* cited by examiner

FLEXIBLE DISPLAY DEVICE

CROSS-REFERENCE TO RELATED APPLICATION(S) AND CLAIM OF PRIORITY

The present application is a continuation of U.S. patent application Ser. No. 14/210,073 filed Mar. 13, 2014, and is related to and claims the priority under 35 U.S.C. § 119(a) to Korean Application Serial No. 10-2013-0026693, which was filed in the Korean Intellectual Property Office on Mar. 13, 2013, the entire contents of each are hereby incorporated by reference.

TECHNICAL FIELD

The present disclosure relates to a display device, and particularly, to a flexible display device which can be deformed into a flexed or rolled state.

BACKGROUND

A device such as an imaging device or a portable phone outputs and provides a picture to a user. For this purpose, such a device is provided with a display device. A liquid crystal display device commonly referred to as a "Liquid Crystal Display (LCD)" is configured in a flat shape and widely used in television sets, computer or notebook monitors, portable terminals or the like as a display device. As elements such as thin film transistors or organic light emitting diodes are developed, such flat display devices have become thinner and implement a sharper picture.

Recently, portable terminals have developed to provide multimedia services through mobile communication networks. Accordingly, in order to provide a larger picture, the portable terminals also use a display device capable of outputting a larger picture. As the display device is enlarged in a portable terminal for which miniaturization and lightening are essentially used, efforts to reduce the thickness of the portable terminals have continued in order to secure portability.

If a display device is flexible, it will be possible to carry the display device in a flexed, folded, or rolled state. Thus, the flexible display device will be capable of greatly contributing to securing portability of a portable terminal while enlarging the screen of the portable terminal. Accordingly, research to make a display device equipped with a flexible display panel commercially available is recently being strengthened.

In configuring a flexible display device, it will be necessary to arrange, for example, various circuit boards, the display device, and integrated circuit chips in such a manner that flexibility can be maintained. For example, even if a display panel is flexible, the display will not be substantially flexible if the circuit boards and the integrated circuit chips, each of which has a considerable surface area, are not flexible when they are laminated on the display panel. Accordingly, if it is desired to implement a flexible display device, the circuit boards laminated on the flexible display panel should also be flexible, and the integrated circuit chips should be fabricated in a sufficiently small size and arranged not to affect the deformation of the display panel.

Further, when designing the sizes and arrangements of the circuit boards and the integrated circuit chips to satisfy such conditions, the display panel should be prevented from being damaged. For example, when the display device is deformed into a flexed or rolled state, it is obvious that in the laminated structure, the spaces between the display panel and each of the circuit boards and integrated circuit chips will be narrowed compared to the spaces in the state where the display device is not deformed. Accordingly, depending on the degree of deformation of the display device, the integrated circuit chips may interfere with and come into contact with the display panel causing damage to the display panel. Further, in view of the characteristics of the flexible display device, it is obvious that the display device may be locally deformed by, for example, an external shock. Such a local deformation may cause the integrated circuit chips to come into contact with the display device and cause damage to it.

SUMMARY

To address the above-discussed deficiencies, it is a primary object to provide a display device which is capable of preventing damage of a display panel while retaining flexibility.

In addition, the present disclosure is to provide a display device which is reduced in thickness to improve flexibility.

Further, the present disclosure is to provide a display device which has an improved degree of freedom in arranging integrated circuit chips or the like while retaining flexibility.

Accordingly, the present disclosure discloses a flexible display device including: a flexible display panel; a flexible printed circuit board extending from the display panel; an integrated circuit chip that is mounted on at least one surface of the flexible printed circuit board and drives the display panel; and a protection member attached to a rear surface of the display panel.

When the flexible printed circuit board is flexed to be partially positioned on the rear surface of the display panel, the protection member is positioned between the display panel and the integrated circuit chip.

The flexible printed circuit board may be interposed between the integrated circuit chip and the protection member.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
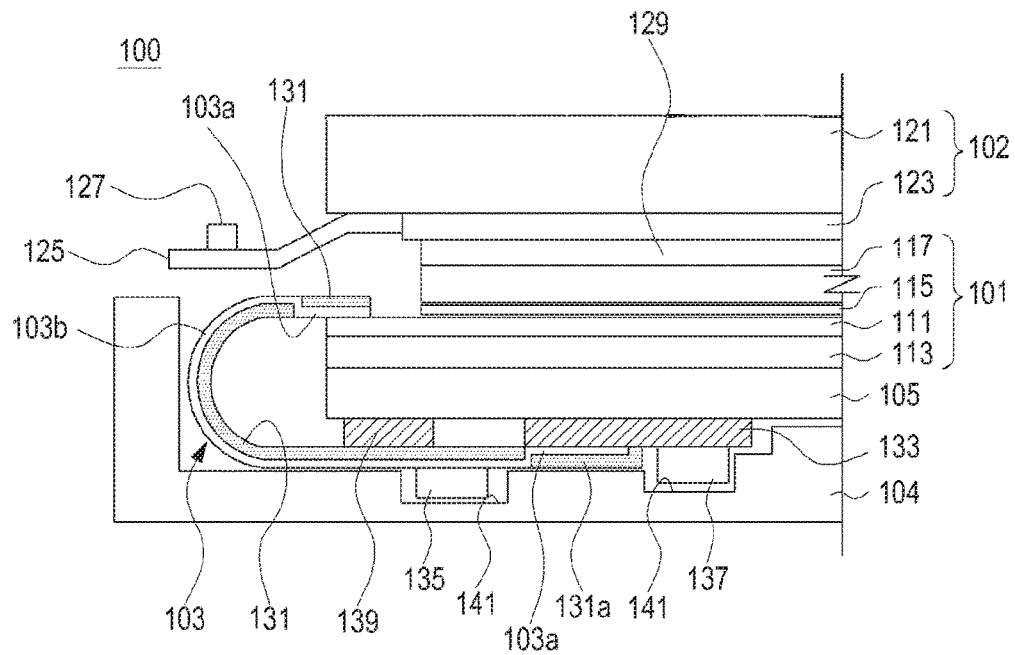
FIG. 1 illustrates a vertical cross-sectional view of a configuration of a flexible display device according to an example embodiment of the present disclosure.
Figure 2:
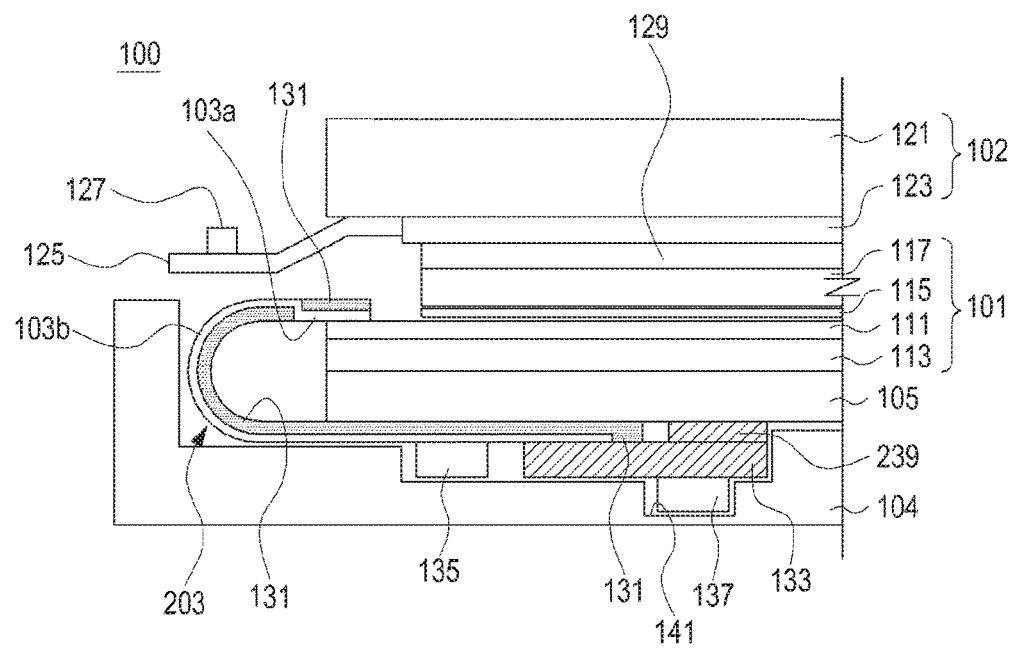
FIG. 2 illustrates a vertical cross-sectional view of a configuration of a modified example of the flexible display device illustrated in FIG. 1.
Figure 3:
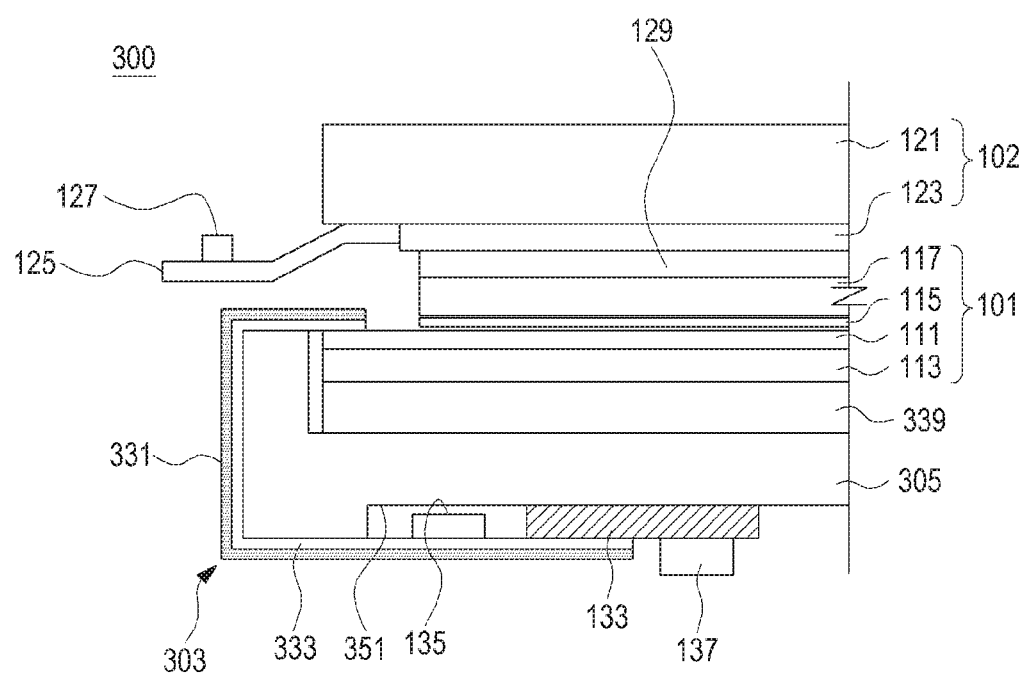
FIG. 3 illustrates a vertical cross-sectional view of a configuration of a flexible display device according to another example embodiment of the present disclosure.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system and method. Hereinafter, various embodiments of the present disclosure will be described in detail with reference to the accompanying drawings. For the purposes of clarity and simplicity, a detailed description of known functions and configurations incorporated herein will be omitted as it may make the subject matter of the present disclosure rather unclear.

A display device according to the present disclosure includes a flexible display panel, a flexible printed circuit board that connects a driving circuit chip such as an integrated circuit chip that drives the display panel or a main circuit board to the display panel, and a protection member. Considering that the display device is flexible, it is obvious that the main circuit board should also be made of a flexible material. In such a case, the flexible printed circuit board may be disposed to be bent to be partially positioned on a rear surface of the display panel, in which case the protection member is positioned between the flexible printed circuit board and the display panel.

As a result, the protection member protects the rear surface of the display panel to prevent the integrated circuit chip mounted on the flexible printed circuit board and the main circuit board connected to the flexible printed circuit board from interfering with or coming into contact with each other. Further, when a printed circuit pattern is formed on each surface of the flexible printed circuit board, integrated circuit chips connected to the display panels may be disposed on either surface of the flexible printed circuit board. Accordingly, the arrangement of the integrated circuit chips may be more freely designed.

FIG. 1 illustrates a vertical cross-sectional view of a configuration of a flexible display device 100 according to an example embodiment of the present disclosure, and FIG. 2 illustrates a vertical cross-sectional view of a configuration of a modified example of the flexible display device 100 illustrated in FIG. 1. The display devices 100 illustrated in FIGS. 1 and 2 are similar to each other in configuration merely except for the arrangements of main circuit boards 133. Accordingly, it shall be noted that the same or similar components will be assigned with the same reference numerals in describing the display devices 100 illustrated in FIGS. 1 and 2.

As illustrated in FIG. 1, the flexible display device 100 according to an example embodiment of the present disclosure includes a flexible display panel 101, a flexible printed circuit board 103 of which a part extends from the flexible display panel 101 and is positioned on a rear surface of the display panel 101, and a protection member 105 interposed between the part of the flexible printed circuit board 103 and the display panel 101.

The display panel 101 may be configured using an Organic Light Emitting Diode (OLED) element and provided with light emitting film 111 attached to a surface of a base film 113. The light emitting film 111 is an element that practically outputs a picture and may be made of a polyimide film on which a thin film transistor or the like is arranged. In general, a display panel is configured such that the light emitting film is disposed on each of the front and rear surfaces of the light emitting film. However, the display panel 101 is configured such that a base film 113 made of a synthetic polymer resin and a Thin Film Encapsulation (TFE) 115 are disposed on the front and rear surfaces of the light emitting film 111, respectively. Accordingly, unlike an ordinary flat display panel, the display panel 101 is deformable into, for example, a flexed or rolled state to take a curved shape and may output a picture even after being deformed.

Further, the display panel 101 may be provided with a polarization-functional film, for example, a Polyvinyl Alcohol (PVA) film 117 and, although not illustrated, may also be provided with a Tri-Acetyl Cellulose (TAC) or the like that protects the PVA film 117. The detailed configuration of the display panel 101 somewhat departs from the gist of the present disclosure and, thus, a detailed description thereof will be omitted. In other words, the flexible display device 100 according to the present disclosure may also be configured using any type of flexible display panel.

When it is desired to incorporate a touch screen function in the display device 100, a touch screen window 102 may be disposed on the display panel 101. The touch screen window 102 has a configuration in which a transparent electrode film, for example, an Indium-Tin Oxide (ITO) film 123 is attached to a window member 121 to protect the display panel 101 while providing a touch screen function. The ITO film 123 detects a user's input action and transfers the input action through a separate circuit board 125 and an integrated circuit chip 127. When the touch screen function is not incorporated in the display device 100, the ITO film 123 does not have to be disposed.

The ITO film 123 may be attached to the PVA film 117 by lamination. For this purpose, a laminating film 129 may be interposed between the ITO film 123 and the PVA film 117.

The protection member 105 is attached to the rear surface of the display panel 101 to protect the display panel 101. The protection member 105 is fabricated in a film shape using aluminum, magnesium or the like to ensure that the protection member 105 may retain its flexibility while being attached to the display panel 101. Alternatively, when the protection member 105 is made of an elastic material, external shock may be dispersed. When the protection member 105 is attached to the rear surface of the display panel 101, the integrated circuit chip 135 or the like mounted on the flexible printed circuit board 103 may be prevented from making direct contact with the display panel 101 even if the flexible printed circuit board 103 is partially positioned at the rear side of the display panel 101.

The flexible printed circuit board 103 is provided to connect the display panel 101 to the main circuit board 133 including a central processing device or the like, and dispose the integrated circuit chip 135 including a driving circuit chip thereon. In configuring the flexible printed circuit board 103, it is desirable to form printed circuit patterns 103a and 103b on the both surfaces of the flexible printed circuit board 103 in which the printed circuit pattern (hereinafter, referred to as a "first printed circuit pattern") 103a formed on one surface and the printed circuit pattern (hereinafter, referred to as a "second printed circuit pattern") 103b formed on the other surface are electrically connected with each other a via hole formed through a board film 131 of the flexible printed circuit board 103, a metallic layer or the like.

When the printed circuit patterns 103a and 103b are formed on the both surfaces of the flexible printed circuit board 103, respectively, the integrated circuit chip 135 or the main circuit board 133 may be disposed either surface of the flexible printed circuit board 103. Of course, the first and second printed circuit patterns 103a and 103b will be differently designed depending on the surface or position where the integrated circuit chip 135 or the main circuit board 133 is disposed. Accordingly, it is possible to improve a degree of freedom of design in arranging the integrated circuit chip 135 or the main circuit board 133.

The first printed circuit pattern 103a is directly connected to the display panel 101 and the integrated circuit chip 135 is mounted on the surface of the flexible printed circuit board 103 where the second printed circuit pattern 103b is formed. Accordingly, when the integrated circuit chip 135 is positioned on the rear surface of the display panel 101, the protection member 105 and the flexible printed circuit board 103 are interposed between the integrated circuit chip 135 and the display panel 101. In other words, the integrated circuit chip 135 does not directly face the display panel 101 even if it is disposed on the rear surface of the display panel 101. Consequently, even if the display device 100 is deformed, the protection member 105 and the flexible printed circuit board 103 prevent the integrated circuit chip 135 being interfered with the display panel 101.

The flexible printed circuit board 103, and in an embodiment, a part of the board film 131, is attached on the rear surface of the display panel 101. An adhesive layer 139 may be formed between the flexible printed circuit board 103 and the protection member 105 so as to fix the flexible printed circuit board 103 on the rear surface of the display panel 101.

As described above, the main circuit board 133 is preferably made of a flexible board material. FIG. 1 illustrates a configuration in which the main circuit board 133 is disposed on the one surface and FIG. 2 illustrates a configuration in which the main circuit board 133 is disposed on the other surface. When the main circuit board 133 is disposed on the other surface of the flexible printed circuit board 203, an adhesive layer 239 may be formed between the main circuit board 133 and the protection member 105. The adhesive layer 239 formed between the main circuit board 133 and the protection member 105 is formed to be as thick as the flexible printed circuit board 203.

The display device 100 as described above may be provided with a bracket 104 that protects the display panel 101, the flexible printed circuit board 103 or 203, and the like. The bracket 104 is provided to enclose at least the protection member 105, preferably the rear surface and the periphery of the display panel 101. When the integrated circuit chip 135, the main circuit board 133 or the integrated circuit chip 137 mounted on the main circuit board 133 protrudes from the flexible printed circuit board 103 or 203, it is desirable to form an accommodation recess 141 on the bracket 104 to accommodate the protruding integrated circuit chip, and the like.

When the bracket 104 is disposed, the display device 100 takes a single module shape, and in a real product manufacturing, it is also desirable to provide the bracket 104.

When the accommodation recess 141 is formed to accommodate the integrated circuit chip 135 and the like, the increase of thickness of the display device 100 may be minimized even though the bracket 104 is stacked with the display panel 101, the integrated circuit chip 135, and the like.

FIG. 3 illustrates a vertical cross-sectional view of a configuration of a flexible display device 300 according to another example embodiment of the present disclosure. The flexible display device 300 according to the present example embodiment is different from the prior example embodiments in that a protection member is also used as a bracket. Accordingly, it shall be noted that the components which may be easily understood from those of the prior example embodiments may be assigned with the same reference numerals or may not be assigned a reference numeral and the detailed descriptions thereof may be omitted.

The protection member 305 is formed such that one surface facing the display panel 101 is flat. Accordingly, it is easy to attach the display panel 101 to the protection member 305. In addition, since the flexible display panel 101 is attached and fixed to the flat surface, a uniform curvature radius may be secured when the flexible display panel 101 is deformed into a flexed or rolled state. In other words, before and after deformation, an unnecessary flexure may be prevented from being generated on the display panel 101. An adhesive layer 339 is provided between the display panel 101 and the protection member 305 so as to adhere and fix the display panel 101 to the protection member 305.

The flexible printed circuit board 303 extending from the display panel 101 of the display device 300 extends to enclose the periphery of the protection member 305. Accordingly, a part of the flexible printed circuit board 303 is positioned to face the other surface of the protection member 305. The integrated chip 135 such as the driving circuit chip of the display panel 101 or the main circuit board 133 may be mounted on a surface of the flexible printed circuit board 303 to be positioned to face the other surface of the protection member 305. On the other surface of the protection member 305, it is desirable to form an accommodation recess 351 that accommodates the integrated circuit chip 135 mounted on the flexible printed circuit board 303 or the main circuit board 133.

A flexible display device configured as described above prevents an integrated circuit chip stacked with a display panel from coming into direct contact with the display panel using a protection member. Thus, even if the display device is deformed into, for example, a flexed or rolled state, it is possible to prevent the display panel from being damaged. That is, the damage of the display panel may be prevented in the course of fabricating the display device or during use of the final product. Further, in configuring a flexible printed circuit board on which an integrated circuit chip is mounted, when a printed circuit pattern is formed on each surface of the flexible printed circuit board, the integrated circuit chip may be disposed to face the display panel with the flexible printed circuit board being interposed therebetween. As a result, a degree of freedom of design in arranging the integrated circuit chip may be improved. Moreover, when an accommodation recess is formed on a bracket provided to enclose the protection member or the display panel so as to accommodate the integrated circuit chip, and the like, an increase of thickness by the integrated circuit chip may be substantially prevented. Therefore, it is easy to reduce the thickness of the display device. The reduction of thickness of the display device may contribute to improving the flexibility of the display device allowing it to more easily be flexed or rolled.

Although the present disclosure has been described with an example embodiment, various changes and modifications may be suggested to one skilled in the art. It is intended that the present disclosure encompass such changes and modifications as fall within the scope of the appended claims.

What is claimed is:

1. An electronic device comprising:
a flexible display panel;
a flexible circuit board connecting the flexible display panel to a first circuit board;
an integrated circuit chip mounted between first and second ends of a first surface of the flexible circuit board, wherein the integrated circuit chip is configured to drive the flexible display panel;
a protection member disposed between the flexible circuit board and the flexible display panel; and
a bracket having an accommodation recess formed thereon, wherein the accommodation recess accommodates the integrated circuit chip, and wherein the accommodation recess is disposed below the flexible circuit board,
wherein the flexible circuit board is connected to the flexible display panel at the first end of the flexible circuit board, and connected to the first circuit board at the second end of the flexible circuit board,
wherein the flexible circuit board is disposed between the integrated circuit chip and the protection member,
wherein the integrated circuit chip is disposed below the protection member, and
wherein the flexible circuit board includes:
a first circuit pattern formed on the first surface and connected to the integrated circuit chip, and
a second circuit pattern formed on a second surface and connected to the flexible display panel,
wherein the first and second circuit patterns are electrically connected with each other in the flexible circuit board.

2. The electronic device of claim 1, wherein the flexible circuit board is partially interposed between the integrated circuit chip and the protection member.

3. The electronic device of claim 1, wherein, the first circuit board is disposed on a portion of the protection member.

4. The electronic device of claim 1, wherein the flexible circuit board is flexed such that at least a portion of the flexible circuit board is attached to the protection member.

5. The electronic device of claim 1, wherein the second circuit pattern is directly connected to traces of the flexible display panel at the first end of the flexible circuit board and directly connected to the first circuit board at the second end of the flexible circuit board.

6. The electronic device of claim 1, wherein the second circuit pattern is directly connected to traces of the flexible display panel at the first end of the flexible circuit board and the first circuit pattern is directly connected to the first circuit board at the second end of the flexible circuit board.

7. The electronic device of claim 1, wherein the first circuit board is made of a flexible material substrate.

8. The electronic device of claim 1, further comprising:
an adhesive layer formed between a portion of the flexible circuit board and the protection member, wherein the portion of the flexible circuit board is attached to the protection member by the adhesive layer.

9. An electronic device comprising:
a flexible display panel;
a flexible circuit board connecting the flexible display panel to a first circuit board of the electronic device, wherein the first circuit board is made of a flexible material substrate;
an integrated circuit chip that is mounted on a first surface of the flexible circuit board and disposed between a first end and a second end of the flexible circuit board, wherein the integrated circuit chip is configured to drive the flexible display panel; and
a bracket having an accommodation recess formed thereon, wherein the accommodation recess accommodates the integrated circuit chip, and wherein the bracket is disposed below the flexible circuit board,
wherein, the flexible circuit board is at least partially disposed below a rear surface of the flexible display panel such that the second end of the flexible circuit board and the integrated circuit chip are disposed below the rear surface of the flexible display panel,
wherein the flexible circuit board is connected to the flexible display panel at the first end of the flexible circuit board, and connected to the first circuit board at the second end of the flexible circuit board,
wherein the flexible circuit board is disposed between the integrated circuit chip and the rear surface of the flexible display panel, and
wherein the flexible circuit board includes:
a first circuit pattern formed on the first surface, directly connected to the integrated circuit chip and directly connected to the first circuit board, and
a second circuit pattern formed on a second surface and directly connected to the flexible display panel,
wherein the first and second circuit patterns are electrically connected with each other in the flexible circuit board.

10. The electronic device of claim 9, further comprising a protection member disposed between the flexible circuit board and a rear surface of the flexible display panel, wherein the flexible circuit board is partially interposed between the integrated circuit chip and the protection member.

11. The electronic device of claim 9, further comprising:
a protection member disposed between the flexible circuit board and a rear surface of the flexible display panel,
an adhesive layer formed between a portion of the flexible circuit board and the protection member,
wherein the portion of the flexible circuit board is attached to the protection member through the adhesive layer below the rear surface of the flexible display panel.

12. The electronic device of claim 9, further comprising a protection member disposed between the flexible circuit board and a rear surface of the flexible display panel, wherein the flexible circuit board is partially positioned below the rear surface of the flexible display panel, and the first circuit board is disposed to at least partially face the protection member.

13. The electronic device of claim 9, wherein the second circuit pattern is directly connected to traces of the flexible display panel at the first end of the flexible circuit board.

14. The electronic device of claim 9, further comprising a protection member disposed between the flexible circuit board and a rear surface of the flexible display panel, wherein at least a part of the first circuit board is attached to the protection member through another adhesive layer.

* * * * *